United States Patent
Tonomura et al.

(10) Patent No.: US 10,511,331 B2
(45) Date of Patent: Dec. 17, 2019

(54) CHANNEL DECODING METHOD AND CHANNEL DECODING DEVICE

(71) Applicant: NIPPON TELEGRAPH AND TELEPHONE CORPORATION, Tokyo (JP)

(72) Inventors: Yoshihide Tonomura, Yokosuka (JP); Tatsuya Fujii, Yokosuka (JP); Takahiro Yamaguchi, Yokosuka (JP); Daisuke Shirai, Yokosuka (JP); Takayuki Nakachi, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 501 days.

(21) Appl. No.: 14/912,054

(22) PCT Filed: Aug. 8, 2014

(86) PCT No.: PCT/JP2014/070982
§ 371 (c)(1),
(2) Date: Feb. 12, 2016

(87) PCT Pub. No.: WO2015/022910
PCT Pub. Date: Feb. 19, 2015

(65) Prior Publication Data
US 2016/0191080 A1     Jun. 30, 2016

(30) Foreign Application Priority Data
Aug. 16, 2013    (JP) .................................. 2013-169065

(51) Int. Cl.
*H03M 13/23* (2006.01)
*H03M 13/00* (2006.01)

(52) U.S. Cl.
CPC ......... *H03M 13/23* (2013.01); *H03M 13/611* (2013.01)

(58) Field of Classification Search
CPC   H03M 13/23; H03M 13/611; H03M 13/1111; H03M 13/45; H03M 13/616
See application file for complete search history.

(56) References Cited

U.S. PATENT DOCUMENTS 6,307,487 B1 *  10/2001  Luby .................. H03M 13/1191
                                                          341/50
6,373,406 B2     4/2002  Luby
(Continued)

FOREIGN PATENT DOCUMENTS

| JP | S61257024 | 11/1986 |
| JP | H06059032 | 3/1994 |
| JP | 2009-049463 | 3/2009 |

OTHER PUBLICATIONS

R. G. Gallager, "Low density parity check codes," in Research Monograph series. Cambridge, MIT Press, 1963.
(Continued)

*Primary Examiner* — Thien Nguyen
(74) *Attorney, Agent, or Firm* — Ohlandt, Greeley, Ruggiero & Perle, L.L.P.

(57) ABSTRACT

This method and device makes it possible to implement maximum likelihood decoding of a sparse graph code at low computational complexity in the maximum likelihood decoding of the sparse graph code. This is, in the maximum likelihood of decoding of the sparse graph code, a lost data decoding process by a trivial decoding method and a lost data decoding process by a Gauss elimination method are performed repeatedly and alternately.

12 Claims, 10 Drawing Sheets

(56) References Cited

U.S. PATENT DOCUMENTS

| | | | |
|---|---|---|---|
| 6,856,263 B2* | 2/2005 | Shokrollahi | H03M 13/1191 341/50 |
| 6,909,383 B2* | 6/2005 | Shokrollahi | H03M 13/1102 341/50 |
| 2003/0058958 A1 | 3/2003 | Shokrollahi et al. | |
| 2008/0170591 A1* | 7/2008 | Kameyama | H04L 1/0041 370/476 |
| 2009/0183047 A1* | 7/2009 | Lampe | H03M 13/033 714/752 |
| 2010/0199142 A1* | 8/2010 | Greferath | H03M 13/11 714/752 |
| 2010/0257427 A1* | 10/2010 | Xu | H03M 13/116 714/752 |
| 2011/0060960 A1* | 3/2011 | Yuan | H03M 13/1191 714/752 |
| 2011/0099446 A1* | 4/2011 | Murakami | H04L 1/0041 714/748 |

OTHER PUBLICATIONS

M. Luby, "LT Codes," The 43rd Annual IEEE Symposium on Foundations of Computer Science, 2002.

A. Shokrollahi, "Raptor Codes", IEEE Transactions on Information Theory, vol. 52, No. 6, Jun. 2006, pp. 1-17.

"Asynchronous layered coding protocol instantiation," IETF RFC 3450, Dec. 2002.

E. Paolini, G. Liva, B. Matuz, and M. Chiani, "Maximum likelihood erasure decoding of LDPC codes: pivoting algorithms and code design," IEEE Trans. Commun. vol. 60, No. 11, pp. 3209 to 3220, Nov. 2012.

Cunche, M. and V. Roca, "Optimizing the Error Recovery Capabilities of LDPC-Staircase Codes Featuring a Gaussian Elimination Decoding Scheme," 10th IEEE International Workshop on Signal Processing for Space Communications (SPSC7'08), Oct. 2008.

Kunitaka Murotsu, et al., "An Erasure Correction Scheme based on BP and Gaussian Eliminaion", Dai 27 Kai Symposium on Information Theory and its Applications Yokoshu, Dec. 14, 2004 (Dec. 14, 2004.), separate vol. 1, pp. 271 to 274.

Koo Matsushita et al., "Performance Evaluation of a Combination of Sum-Product and Two-bit Bit Flipping Decoding Algorithms", IEICE Technical Report, Feb. 28, 2013 (Feb. 28, 2013), vol. 112, No. 462, pp. 65 to 70, IT2012-72.

International Search Report dated Oct. 28, 2014 corresponding to International Patent Application No. PCT/JP2014/070982; 2 pages.

International Preliminary Report on Patentability dated Feb. 25, 2016 corresponding to PCT/JP2014/070982; 7 pages.

Extended European Search Report dated May 10, 2017 for PCT/JP2014/070982, 11 pages.

Cunche, "Codes AL-FEC hautes performances pour les canaux 'a effacements : variations autour des codes LDPC", Jun. 30 2010, with English summary and abstract, 191 pages.

Huang, "Fountain Codes with Message Passing and Maximum Likelihood Decoding over Erasure Channels", School of Electrical Engineering and Computer Science, Ohio University, Athens, Ohio, 5 pages, published by IEEE, 2011.

Yang, "Comparison of Decoding Turbo Gallager Codes in Hybrid Decoding Arrangements with Different Iterative Decoders over the Erasure Channel", Fixed and Mobile Communications Research, University of Plymouth, United Kingdom, 5 pages, published by IEEE, 2008.

European Patent Application dated Sep. 3, 2018 in corresponding European Patent Application No. 14836232.0 6 pages.

\* cited by examiner

CHANNEL DECODING METHOD AND CHANNEL DECODING DEVICE

BACKGROUND

1. Field of the Disclosure

The present disclosure relates to a method and a device which are capable of performing fast maximum likelihood decoding at low computational complexity by decreasing lost data restored by a Gauss elimination method whenever possible and increasing lost data restored by a trivial decoding method based on a message passing algorithm (MPA) whenever possible in maximum likelihood decoding of a sparse graph code.

2. Discussion of the Background Art

Currently, the error correction technique is widely being used in various kinds of communication systems such as communication in digital satellite broadcasting or the Internet or communication in mobile terminals. Particularly, with the recent development of a broadband environment, for example, a moving image delivery service using the Internet is expected, and the error correction technique became consequential to the Internet. The following description will proceed with the Internet as an example.

If a channel is observed from a side at providing service using the Internet, the Internet may be regarded as an erasure channel (a packet erasure channel (PEC)). This is a channel in which binary erasure channels are grouped in units of packets, and a channel output is output based on correct information at a probability of 1-p or output (lost) as an unidentified # at a probability of p due to a certain failure occurring in a line as illustrated in FIG. 1. In this communication system, a lost packet restoration technique such as forward error correction (FEC) or automatic repeat request (ARQ) is used. In a common IP-based service, a TCP/IP protocol is used, only error detection is performed at a decoder side, and when an error occurs, a method of restoring an error through retransmission control or the like is used (an ARQ scheme). However, when a large-scaled service such as multicast delivery is considered, error correction is required to be performed based on data received by a receiver side, and a method capable of correcting an error only at the reception without requiring a feedback channel is used (a FEC scheme). In the FEC scheme, since retransmission control or the like is not performed, a delay is small, and the FEC scheme is used even in a teleconference system in which a real-time property is important. The following description will proceed with the FEC scheme.

As the FEC scheme, a Reed Solomon code (an RS code) is widely used in digital broadcasting or the like. In Japanese digital broadcasting, a code length of 204 bytes is defined, and tolerance to an error is given by adding parity bytes of about 10% to original data 188 bytes. However, commonly, performance is known to be improved when a code with a large code length is used as an error correction code, but when a code length is long, an adverse effect in which decoding is complicated, and computational complexity enormously increases is also known. For this reason, in the RS code, a code length of 256 bytes or less is assumed to be dealt. Further, when the RS code adapts to a packet called an IP-based packet level FEC, it is necessary to deal 256 packets as a block due to this reason.

On the other hand, a decoding technique based on a message passing algorithm (MPA) is known to have excellent decoding characteristics at practical computational complexity when a code length is long, and a low density parity check (LDPC) code (for example, see Non Patent Literature 1) serving as a linear code defined by a sparse graph has attracted attention as a realistic error correction method approaching to a channel capacity defined by Shannon. Here, the sparse graph is a graph in which the number of edges is much smaller than the number of nodes. Further, as an erasure correction code based on the sparse graph, an LT code of Digital Fountain, Inc. (for example, see Non Patent Literature 2) and a Raptor code (for example, see Non Patent Literature 3) are known, code characteristics capable of decoding by only receiving arbitrary code data without significantly deteriorating coding efficiency are known to be implemented at fulfilling computational complexity. Since this property is suitable for asynchronous layered coding (ALC) (for example, see Non Patent Literature 4) serving as an Internet multicast protocol, it is widely used, for example, in a multicast communication with a layered configuration.

Patent Literature 1: M. Luby, "Information Additive Code Generator and Decoder for Communication Systems," U.S. Pat. No. 6,307,487, Oct. 23, 2001

Patent Literature 2: M. Luby, "Information Additive Code Generator and Decoder for Communication Systems," U.S. Pat. No. 6,373,406, Apr. 16, 2002

Patent Literature 3: A. Shokrollahi, S. Lassen, and M. Luby, "Multi-Stage Code Generator and Decoder for Communication Systems," U.S. Patent Application No. 20030058958, December 2001

Patent Literature 4: A. Shokrollahi, S. Lassen and R. Karp, "Systems and Processes for Decoding Chain Reaction Codes Through Inactivation," U.S. Pat. No. 6,856,263, Feb. 15, 2005

Patent Literature 5: A. Shokrollahi and M. Luby, "Systematic Encoding and Decoding of Chain Reaction Codes," U.S. Pat. No. 6,909,383, Jun. 21, 2005 Non Patent Literature Non Patent Literature 1: R. G. Gallager, "Low density parity check codes," in Research Monograph series. Cambridge, MIT Press, 1963

Non Patent Literature 2: M. Luby, "LT Codes," The 43rd Annual IEEE Symposium on Foundations of Computer Science, 2002

Non Patent Literature 3: Shokrollahi, A, "Raptor codes," Information Theory, IEEE Transactions on Volume 52, Issue 6, 2006

Non Patent Literature 4: "Asynchronous layered coding protocol instantiation," IETF RFC 3450, December 2002

Non Patent Literature 5: E. Paolini, G. Liva, B. Matuz, and M. Chiani, "Maximum likelihood erasure decoding of LDPC codes: pivoting algorithms and code design," IEEE Trans. Commun. vol. 60, no. 11, pp. 3209 to 3220, November 2012

Non Patent Literature 6: Cunche, M. and V. Roca, "Optimizing the Error Recovery Capabilities of LDPC-Staircase Codes Featuring a Gaussian Elimination Decoding Scheme," 10th IEEE International Workshop on Signal Processing for Space Communications (SPSC7'08), October 2008

SUMMARY

As described above, the error correction codes using the sparse graph and the MPA achieve coding characteristics that were hardly achieved in the past. However, there is a gap for improvement in performance of the decoding technique based on the MPA and the maximum likelihood decoding technique, and thus the decoding based on the MPA has not extracted a maximum of performance of the sparse graph code.

For these problems, there is a demand that it is desired to execute maximum likelihood decoding although the computational complexity is somewhat increased. As a method of performing maximum likelihood decoding on an erasure channel, a Gauss elimination method is known. The Gauss elimination method is a solution capable of solving a system of linear equations when the number of variables is identical to the number of ranks of equations.

However, when the Gauss elimination method is simply applied, an operation of $O(N^3)$ is necessary for pre-processing of restoring lost data, an operation of $O(N^2)$ is necessary for restoration of lost data, and thus there is a problem in which an applicable data size is reduced, and power efficiency of an error correcting device deteriorates.

The present disclosure was made light of the above, and it is an object of the present disclosure to make it possible to implement maximum likelihood decoding of a sparse graph code at low computational complexity in the maximum likelihood decoding of the sparse graph code.

In order to achieve the above object, in the present disclosure, a lost data decoding process by a trivial decoding method and a lost data decoding process by a Gauss elimination method are performed repeatedly and alternately in the maximum likelihood decoding of the sparse graph code. Here, the trivial decoding method is a solution capable of solving one variable in one equation.

Specifically, a channel decoding device according to the present disclosure includes a maximum likelihood decoding unit that corrects an error of a data string on which an error is occurred due to data loss by performing decoding of lost data using a trivial decoding method and decoding of lost data using a Gauss elimination method on redundant data encoded based on a relation of a sparse graph multiple times alternately and repeatedly.

The maximum likelihood decoding unit may include a storage unit that regards lost data independent of other lost data among the lost data as restored data, and holds an operation result used for decoding of the restored data, a trivial decoding unit that reads the operation result held in the storage unit, decodes the restored data by applying the read operation result to the trivial decoding method, and stores the operation result in the decoding in the storage unit, and a Gauss elimination method decoding unit that reads the operation result held in the storage unit, decodes the restored data by applying the read operation result to the Gauss elimination method, and stores the operation result in the decoding in the storage unit.

The Gauss elimination method decoding unit may include a sorting unit that performs sorting so that an occurrence of fill-in in a pivot selecting/discharging unit which is executed later is reduced, and the pivot selecting/discharging unit that selects a pivot according to a sorting order of the sorting unit, and discharges as a triangular matrix using forward elimination.

The Gauss elimination method decoding unit may further include a trivial column selecting unit that selects a column corresponding to lost data that is restored by the trivial decoding method using anticipated restored data expected to be restored by the Gauss elimination method as a trivial column, and discharges the trivial column as an identity matrix, and a Gauss column selecting unit that selects a Gauss column in order from a column in which a degree of a sparse graph code is large, and increases selection of the Gauss columns one by one until a sum of the Gauss column and the trivial column reaches the number of lost data.

Specifically, a channel decoding method according to the present disclosure includes a maximum likelihood decoding process of correcting an error of a data string on which an error is occurred due to data loss by performing decoding of lost data using a trivial decoding method and decoding of lost data using a Gauss elimination method on redundant data encoded based on a relation of a sparse graph multiple times alternately and repeatedly.

The maximum likelihood decoding process may include regarding lost data independent of other lost data among the lost data as restored data, a trivial decoding process of reading an operation result held in a storage unit that holds the operation result used for decoding of the restored data, decoding the restored data by applying the read operation result to the trivial decoding method, and storing the operation result in the decoding in the storage unit, and a Gauss elimination method decoding process of reading the operation result held in the storage unit, decoding the restored data by applying the read operation result to the Gauss elimination method, and storing the operation result in the decoding in the storage unit.

The Gauss elimination method decoding process may include a sorting process of performing sorting so that an occurrence of fill-in in pivot selecting/discharging which is executed later is reduced, and the pivot selecting/discharging process of selecting a pivot according to a sorting order performed in the sorting process and discharging as a triangular matrix using forward elimination.

The Gauss elimination method decoding process may include a trivial column selecting process of selecting a column corresponding to lost data that is restored by the trivial decoding method using anticipated restored data expected to be restored by the Gauss elimination method as a trivial column and discharging the trivial column as an identity matrix, and a Gauss column selecting process of selecting a Gauss column in order from a column in which a degree of a sparse graph code is large and increasing selection of the Gauss columns one by one until a sum of the Gauss column and the trivial column reaches the number of lost data.

Specifically, a channel decoding program according to the present disclosure is a channel decoding program causing a computer to execute a maximum likelihood decoding process according to the present disclosure.

According to the present disclosure, it is possible to implement the maximum likelihood decoding of the sparse graph code at low computational complexity in the maximum likelihood decoding of the sparse graph code.

DETAILED DESCRIPTION OF THE PREFERRED EMBODIMENT

Figure 1:
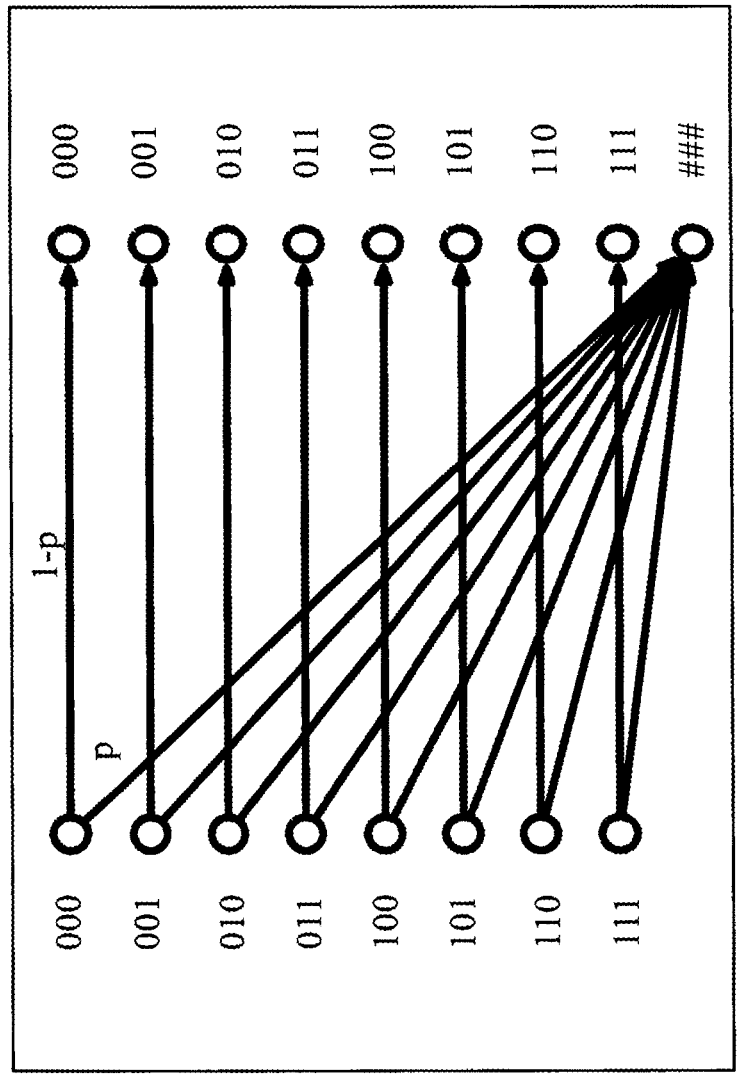
FIG. 1 is an explanatory diagram illustrating a packet erasure channel (a packet erasure channel (PEC)).

Hereinafter, exemplary embodiments of the present disclosure will be described in detail with reference to the appended drawings. The present disclosure is not limited to the following embodiments. The following embodiments are merely examples, and the present disclosure can be carried out in various changed or improved forms based on knowledge of those having skill in the art. In this specification and the drawings, components having the same reference numerals are assumed to be identical to each other.

The present disclosure can be carried out without depending on a type of packet, but the description will proceed with an example of delivery using a UDP protocol used in multicast delivery. If the UDP protocol is used, a retransmission process is not performed even when a UDP packet is lost, unlike a TCP protocol, but it can be realized whether a received packet is correct as illustrated in FIG. 1, and there is a feature that it is regarded as an erasure channel in which a position of a lost packet is accurately known.

Figure 2:
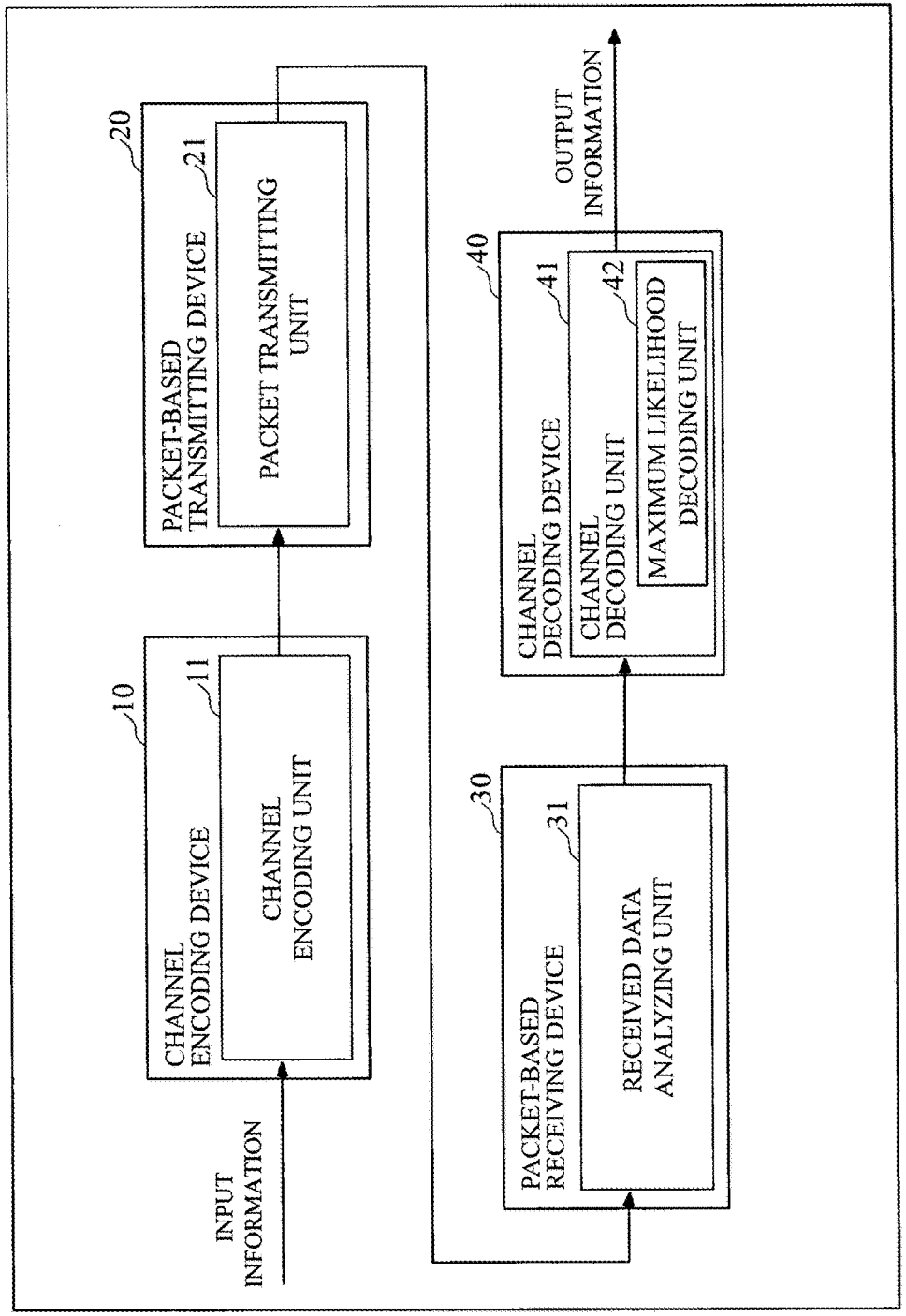
FIG. 2 is a principle configuration diagram of the present disclosure.

FIG. 2 illustrates an error correction function for packet level FEC which can be implemented by the present disclosure. An error correction method according to the present disclosure includes a channel encoding process of performing a function of a channel encoding device 10, a packet-based transmission process of performing a function of a packet-based transmitting device 20, a packet-based receiving process of performing a function of a packet-based receiving device 30, and a channel decoding process of performing a function of a channel decoding device 40 in order. In the channel decoding process, a channel decoding method according to the present disclosure is used.

Input information such as video data or audio data is encoded by the channel encoding device 10. At this time, fragmentation and the like in which a packet size and the like are considered is commonly performed in the packet-based transmitting device 20 connected thereto. As a specific example of the channel encoding device 10, when a linear code such as an LDPC code is used, redundant data is generated by the following encoding process.

[Math 1]

$$C_m^t = [T_{m,m}^{-1}][G_{m,k}]S_k^t \quad (1)$$

Here, S indicates an input information such as video data which performed fragmentation with a certain size, and G and T are sparse matrices corresponding to the sparse graph. An encoding process is known to be performed at a high speed by employing a triangular matrix as T.

The packet-based transmitting device 20 transmits video data or audio data and generated parity data according to a FLUTE standard (RFC 3926) or the like. At a reception side, a transmitted packet is received by the packet-based receiving device 30. The channel decoding device 40 executes the channel decoding process of decoding data of the received packet. At this time, the maximum likelihood decoding unit 42 compares a header format of FLUTE or the like, and makes an attempt to restore a lost packet in case packet loss occurs. It is previously known at the channel decoding device 40 that the following constraint equation is held corresponding to encoding.

[Math 2]

$$0 = [G_{m,k} \mid T_{m,m}]\begin{bmatrix} S_k^t \\ C_m^t \end{bmatrix} \quad (2)$$

$$= [H_{m,n}]x_n^t \quad (3)$$

For this reason, in the channel decoding device 40, when there is a lost packet, reconstructing a lost packet while satisfying the constraint with as a small number of operations as possible becomes a problem. Here, when $\varepsilon_L$ is an index set of a lost packet, $H_{\varepsilon_L}$ is a parity check matrix corresponding to a lost packet, and $x_{\varepsilon_L}$ is a set of lost packets, the above Formula is rewritten as the following Formula:

[Math 4]

$$[H_{\varepsilon_L}]x_{\varepsilon_L}^t = [H_{\varepsilon_R}]x_{\varepsilon_R}^t \quad (4)$$

Here, $\varepsilon_R$ is an index set of a received packet.

If the number of ranks of $H_{\varepsilon_L}$ is the number $|x_{\varepsilon_L}|$ of lost packets in the above Formula, the lost packet can be restored by the maximum likelihood decoding. However, when the Gauss elimination method known as the maximum likelihood decoding method is simply applied to the above Formula, an operation of $O(N^3)$ is necessary for pre-processing of obtaining an inverse matrix of $H_{\varepsilon_L}$, and an operation of $O(N^2)$ is necessary for an operation of restoring the lost packet $x_{\varepsilon_L}$ actually. In order to reduce these operations, for example, techniques disclosed in Non Patent Literature 5 and 6 have been proposed.

According to the present disclosure, when the constraint is satisfied in a channel decoding device, maximum likelihood decoding capable of showing a maximum of error correction capabilities added by a channel encoding device is efficiently implemented at low computational complexity.

First Embodiment

Figure 3:
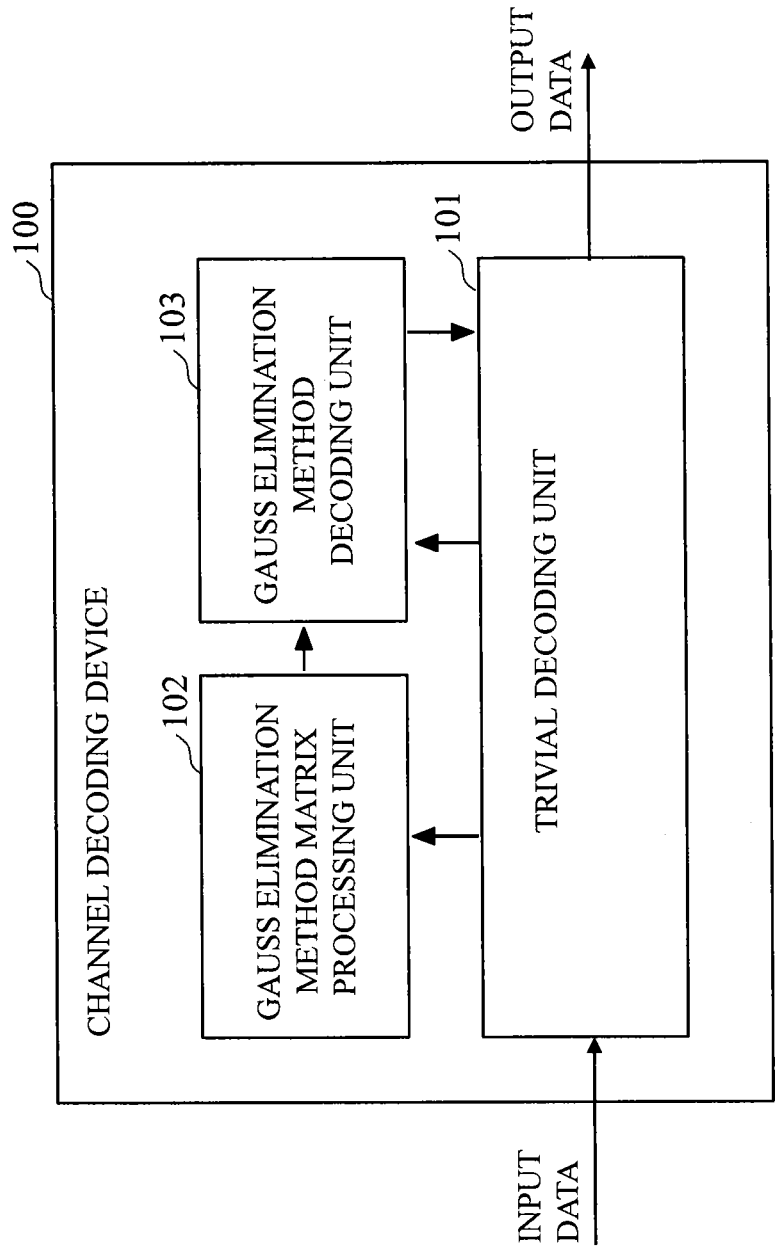
FIG. 3 is a basic configuration diagram illustrating a channel decoding device according to a first embodiment of the present disclosure.

FIG. 3 illustrates a basic configuration diagram of a channel decoding system that implements the maximum likelihood decoding using the trivial decoding method and the Gauss elimination method repeatedly. 101 indicates a trivial decoding unit that restores lost data for each symbol by a small number operations, 102 indicates a Gauss elimination method matrix processing unit that performs pre-processing necessary for decoding lost data through the Gauss elimination method, and 103 indicates a Gauss elimination method decoding unit that restores lost data through the Gauss elimination method based on the matrix process of 102. The respective components will be described below.

Figure 4:
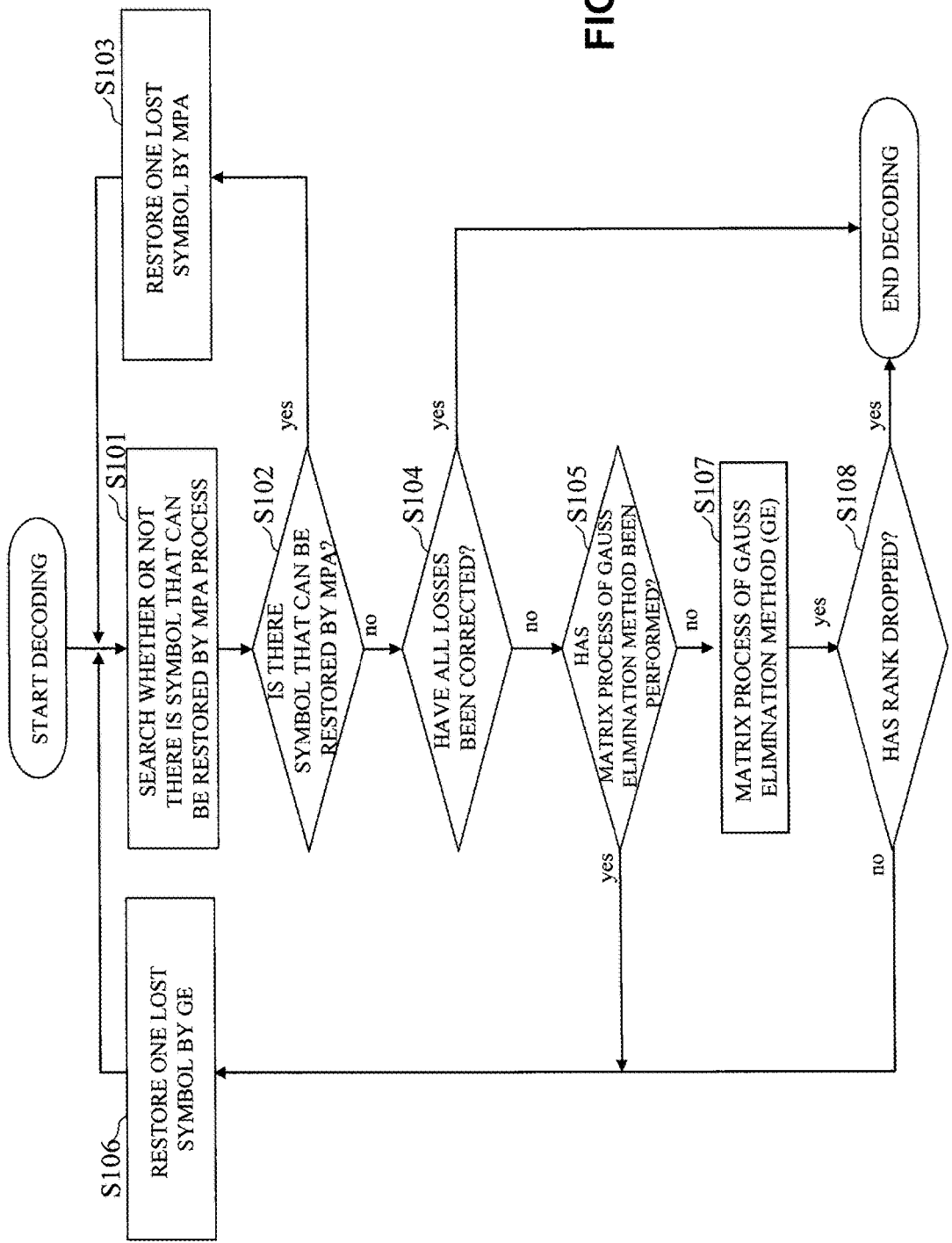
FIG. 4 is a flowchart illustrating an exemplary channel decoding method according to the first embodiment.

The present system is a channel decoding system that efficiently performs the maximum likelihood decoding on loss occurring on the erasure channel by a small number of processes. For the sake of simplicity, as a preferable example in which the present system functions effectively, an example in which IP packet transmission on the Internet serving as a representative channel of an erasure channel is assumed, and an LDPC code configured by a sparse graph is assumed as a code will be described below with reference to FIG. 4.

When input data is input to the channel decoding device 100, the input data is transferred to the trivial decoding unit 101, and an attempt to restore lost data is made (S101 to S103). In the linear code, it is previously known that a product of received data and a parity check matrix H of each block is 0 (zero).

[Math 5]

$$0 = [H_{m,n}]x_n^t \quad (5)$$

Thus, the trivial decoding unit 101 uniquely restores one piece of lost data having no relation with other lost data as restored lost data. This is equivalent to a process of sequentially restoring only one piece of lost data included in each row in the above Formula. The trivial decoding unit 101 can restore lost data through a small number of operations by this processing, if an element thereof is broken down in detail, it can be summed up into two factors: (1) it is unnecessary to perform pre-processing for restoring lost data; and (2) it is possible to restore lost data such as a packet by a small number of processes using characteristics of the sparse graph.

When there is still lost data which has not been able to be restored by the first trivial decoding unit 101 (no in S104), the maximum likelihood decoding is attempted by applying the Gauss elimination method (S105 to S107). This yields an effect of reducing the number of operations of the Gauss elimination method by initially applying the trivial decoding method, similarly to the technique disclosed in Non Patent Literature 6.

In the Gauss elimination method, first, pre-processing of restoring lost data is performed through the Gauss elimination method matrix processing unit 102. The first trivial decoding unit process 101 ends, and when a non-restored lost data index set is $\zeta_L$, a parity check matrix corresponding to a non-restored lost packet is $H_{\zeta_L}$, and a set of non-restored lost packets is $x_{\zeta_L}$, Formula (5) is rewritten as the following Formula:

[Math 6]

$$[H_{\zeta_L}]x_{\zeta_L}^t = [H_{\zeta_R}]x_{\zeta_R}^t \quad (6)$$

Here, $\zeta_R$ is an index set of received data and data restored by the first trivial decoding. An effect obtained by applying the trivial decoding method is derived from that the magnitude by which the Gauss elimination method is applied is $$|\zeta_L| \le |\varepsilon_L|.$$

The Gauss elimination method matrix processing unit 102 performs triangular matrix conversion on the above Formula $H_{\zeta_L}$ through a forward elimination operation. Here, the forward elimination operation is an operation of setting column elements below a pivot to 0 (zero) through an operation between TOWS.

When a matrix obtained by performing triangular matrix conversion through the forward elimination operation is indicated by H', Formula (6) is converted into the following Formula:

[Math 7]

$$[H'_{\zeta_L}]x_{\zeta_L}^t = [H'_{\zeta_R}]x_{\zeta_R}^t \quad (7)$$

Matrix information generated by the Gauss elimination method matrix processing unit 102 is transferred to the Gauss elimination method decoding unit 103, and actually, one or more pieces of lost data $x'_{\zeta_R}$ is restored as restored lost data by backward substitution. Commonly, since decoding of lost data by the backward substitution costs more than decoding of lost data by the trivial decoding method, small restored lost data is desirable in the Gauss elimination method decoding unit 103 in terms of computational complexity. Thus, in this process, it is recommended to restore one piece of lost data which is the smallest restoration number, and data is transferred to the trivial decoding unit 101 again.

Again, in the trivial decoding unit 101, similarly to the first trivial decoding, one piece of lost data having no relation with other lost data is uniquely sequentially restored as restored lost data. When all losses can be recovered, a data string is output as output data (yes in S104), but when there is non-restored data, it returns to the Gauss elimination method decoding unit 103 (no in S104), one piece of lost data is restored as restored lost data, and the process of performing the trivial decoding is repeated until all losses are recovered whenever possible.

As described above, in the channel decoding method according to the present embodiment, the trivial decoding unit 101 performs steps S101 to S105, the Gauss elimination method matrix processing unit 102 performs step S107, and the Gauss elimination method decoding unit 103 performs step S106. As a result, in the disclosure according to the present embodiment, the number of data actually restored by the Gauss elimination method is reduced, and the number of data restored by the trivial decoding method is increased, and thus the maximum likelihood decoding in which the number of operation processes is reduced can be implemented. Further, when the present method is applied so that as a small number of operations as possible is performed, a completion state in which all lost data is decoded is formed by the trivial decoding unit 101.

Second Embodiment

Figure 5:
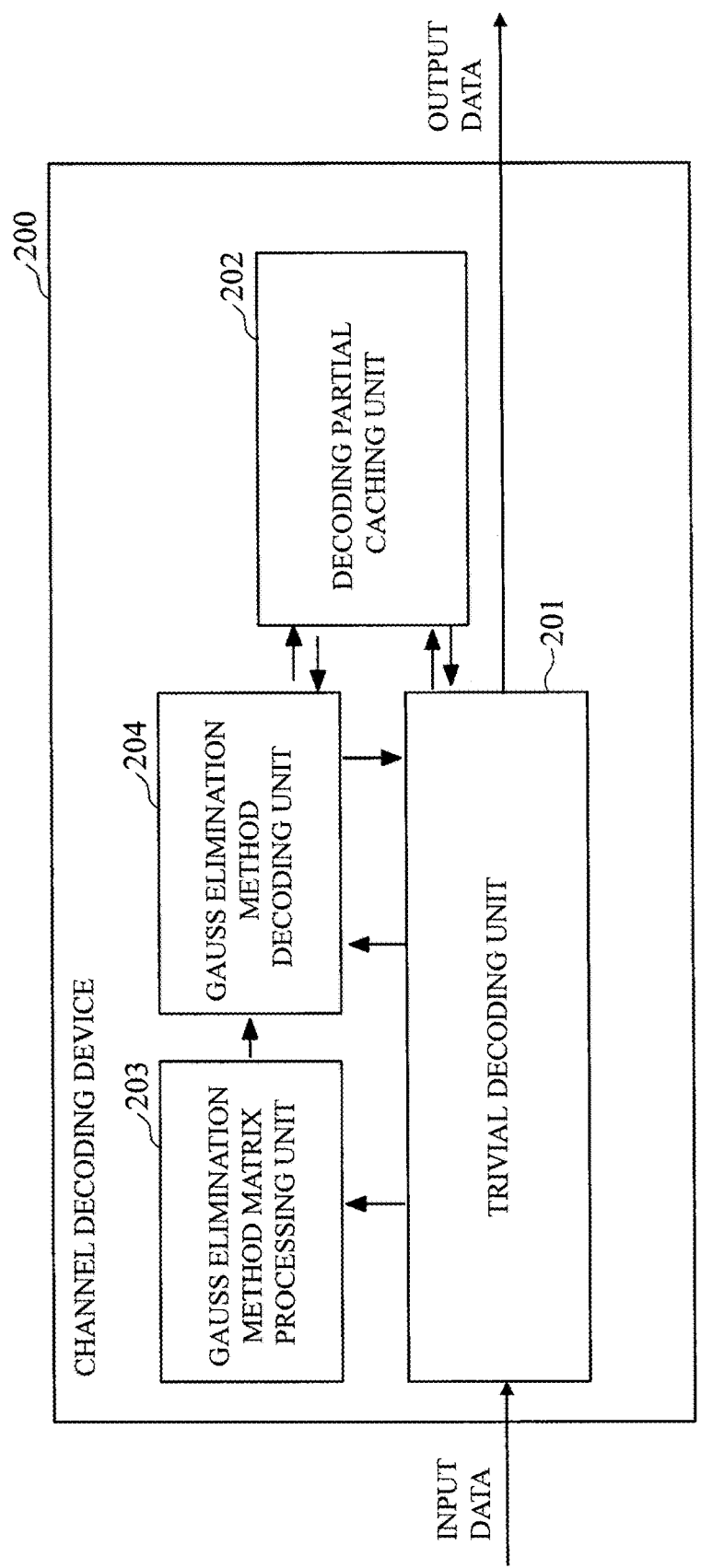
FIG. 5 is a basic configuration diagram illustrating a channel decoding device according to a second embodiment of the present disclosure.

FIG. 5 illustrates a basic configuration diagram of a channel decoding system that implements the maximum likelihood decoding using the trivial decoding method and the Gauss elimination method repeatedly. 201 indicates a trivial decoding unit that restores lost data by a small number operations, 202 indicates a decoding partial caching unit that holds partial data of a restoration operation process as a cache when lost data is reconstructed through the trivial decoding unit 201 and a Gauss elimination method decoding unit 204, 203 indicates a Gauss elimination method matrix processing unit that performs pre-processing necessary for decoding lost data through the Gauss elimination method, and 204 indicates a Gauss elimination method decoding unit that restores lost data through the Gauss elimination method based on the matrix process of 203. The respective components will be described below.

Figure 6:
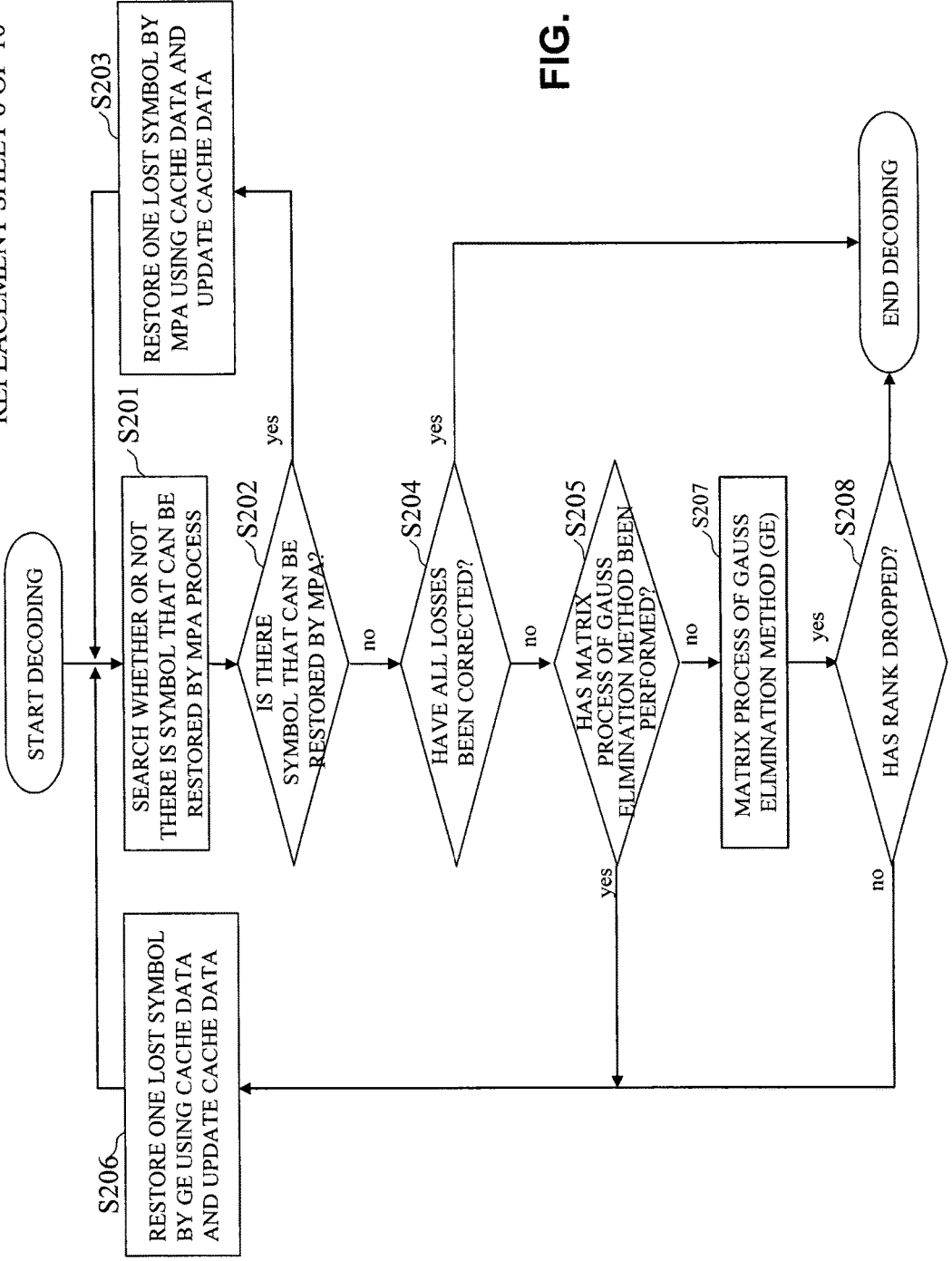
FIG. 6 is a flowchart illustrating an exemplary channel decoding method according to the second embodiment.

The present system is a channel decoding system that efficiently performs the maximum likelihood decoding on loss occurring on the erasure channel by a small number of processes. For the sake of simplicity, similarly to the first embodiment, as a preferable example in which the present system functions effectively, an example in which IP packet transmission on the Internet serving as a representative channel of an erasure channel is assumed, and an LDPC code configured by a sparse graph is assumed as a code will be described below with reference to FIG. 6.

When input data is input to the channel decoding device 200, the input data is transferred to the trivial decoding unit 201, and an attempt to restore lost data is made (S201 to S203). In the linear code, it is previously known that a product of received data and a parity check matrix H of each block is 0 (zero). For this reason, the trivial decoding unit 201 uniquely restores one lost data having no relation with other lost data as the restored lost data.

If all lost data has been restored at the first trivial decoding unit 201 (no in S204), the decoding process ends, and data is output. However, when there is still lost data which has not been able to be restored by the first trivial decoding unit 201, similarly to the first embodiment, the maximum likelihood decoding is attempted by applying the Gauss elimination method (S205 to S207), but part of the operation result calculated by the trivial decoding unit 201 is held in the decoding partial caching unit 202 before the maximum likelihood decoding is attempted. This is because the computational complexity is expected to be reduced by using the held part when lost data is reconstructed by the subsequent Gauss elimination method.

The Gauss elimination method matrix processing unit 203 performs the triangular matrix conversion through the forward elimination, similarly to the first embodiment, but at this time, in order to effectively use the cache of the decoding partial caching unit 202, Formula (6) is changed to the following Formula using an identity matrix I and a cache memory r.

[Math 8]

$$[H_\zeta]x_\zeta{}^t = [I_{m,m}](r + [H_\zeta]x_\zeta{}^t) \quad (8)$$

A matrix that has undergone the triangular matrix conversion is derived as the following Formula:

[Math 9]

$$[H_\zeta']x_\zeta{}^t = [I_{m,m}'](r + [H_\zeta]x_\zeta{}^t) \quad (9)$$

Here, I' is a matrix obtained by performing an operation corresponding to the forward elimination on the identity matrix.

The Gauss elimination method decoding unit 204 restore one or more pieces of lost data through a relational expression derived by the Gauss elimination method matrix processing unit 203, similarly to the first embodiment (S206), but at this time, since a portion corresponding to $[H_\zeta]x_\zeta{}^t$ on the right side of Formula (9) is data already held in the decoding partial caching unit 202, it is possible to additionally reduce the computational complexity using the cache data r. Further, when the lost data is restored, part of the calculated operation result is held in the decoding partial caching unit 202. Specifically, the part is calculation data corresponding to $[H_\zeta]x_\zeta{}^t$ on the right side of Formula (9). Here, it is a partial operation result of a part excluding I' on the right side other than an operation result of the entire right side used for reconstruction of lost data and thus called a partial cache.

When one or more pieces of lost data are restored as restored lost data, it returns to the trivial decoding unit 201 again, and one lost data having no relation with other lost data is uniquely restored as restored lost data. In this process, when all losses can be recovered, a data string is output as output data (yes in S204), but when there is non-restored data (no in S204), it returns to the Gauss elimination method decoding unit 204, one piece of lost data is restored as restored lost data (S205 to S208), and the process of performing the trivial decoding is repeated until all losses are recovered whenever possible.

As described above, in the channel decoding method according to the present embodiment, the trivial decoding unit 201 executes steps S201 to S205, the Gauss elimination method matrix processing unit 203 executes step S207, and the Gauss elimination method decoding unit 204 executes step S206. In these process, when there is already corresponding data in the decoding partial caching unit 202, the corresponding data is read from the caching unit and then used, and when there is no corresponding data, part of a corresponding operation result calculated when lost data is restored is held in the decoding partial caching unit, and thus the number of operation processes can be reduced.

The above embodiment has been described in connection with the example using the diagonal matrix, but the present disclosure is not limited thereto. For example, instead of using the diagonal matrix, an exclusive OR may be used. In this case, an exclusive OR of a packet is performed directly on the data of the decoding partial caching unit 202. In other words, the right side used for reconstruction of lost data is calculated by performing an exclusive OR of a packet directly on $[H_\zeta]x_\zeta{}^t$ on the right side of Formula (8).

Third Embodiment

Figure 7:
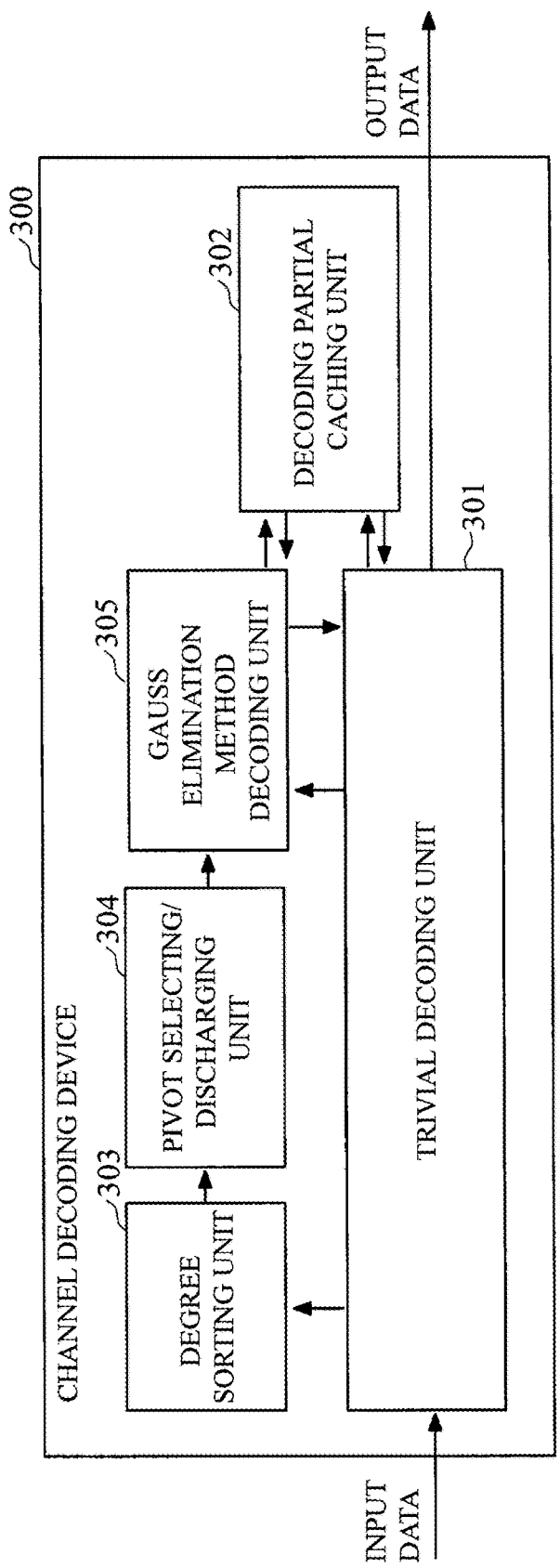
FIG. 7 is a basic configuration diagram illustrating a channel decoding device according to a third embodiment of the present disclosure.

FIG. 7 illustrates a basic configuration diagram of a channel decoding system that implements the maximum likelihood decoding using the trivial decoding method and the Gauss elimination method repeatedly. 301 indicates a trivial decoding unit that restores lost data by a small number operations, 302 indicates a decoding partial caching unit that holds partial data of a restoration operation process as a cache when lost data is reconstructed at the trivial decoding unit 301 and a Gauss elimination method decoding unit 305, 303 indicates a degree sorting unit that sorts the sparse graphs according to a degree, 304 indicates a pivot selecting/discharging unit that selects a pivot and performs the forward elimination, and 305 indicates a Gauss elimination method decoding unit that actually restores lost data. Here, the pivot refers to an axis used as a reference when the forward elimination is performed. The respective components will be described below.

Figure 8:
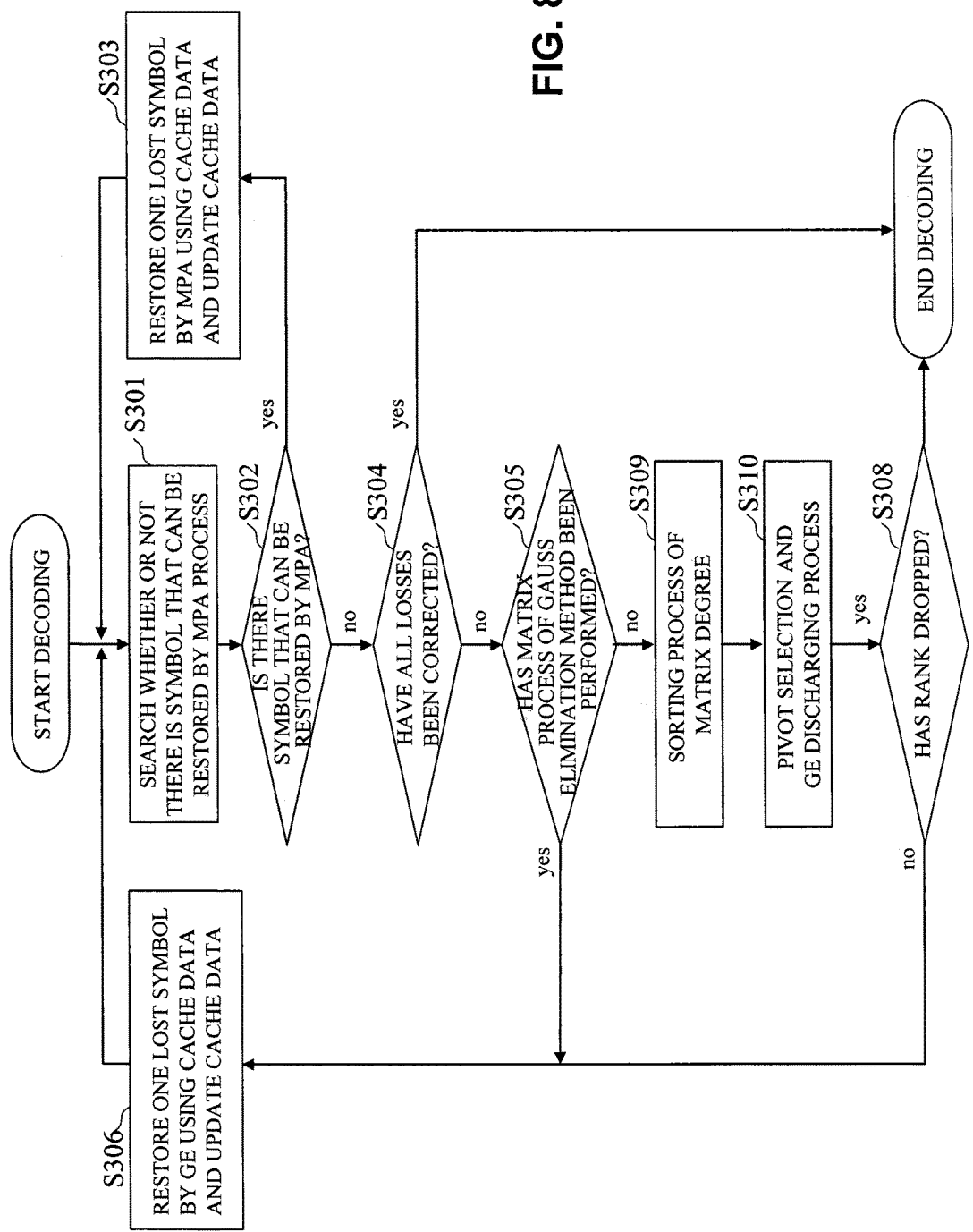
FIG. 8 is a flowchart illustrating an exemplary channel decoding method according to the third embodiment.

The present system is a channel decoding system that efficiently performs the maximum likelihood decoding on loss occurring on the erasure channel by a small number of processes. For the sake of simplicity, similarly to the first and second embodiments, as a preferable example in which the present system functions effectively, an example in which IP packet transmission on the Internet serving as a representative channel of an erasure channel is assumed, and an LDPC code configured by a sparse graph is assumed as a code will be described below with reference to FIG. 8.

When input data is input to the channel decoding device 300, the input data is transferred to the trivial decoding unit 301, and an attempt to restore lost data is made (S301 to S303). In the linear code, it is previously known that a product of received data and a parity check matrix H of each block is 0 (zero). For this reason, the trivial decoding unit 301 uniquely restores one lost data having no relation with other lost data as the restored lost data.

If all lost data has been restored at the first trivial decoding unit 301 (yes in S304), the decoding process ends, and data is output. However, when there is still lost data which has not been able to be restored by the first trivial decoding unit 301 (no in S304), similarly to the first and second embodiments, the maximum likelihood decoding is attempted by applying the Gauss elimination method (S306), but the restored data calculated by the trivial decoding unit 301 is held in the decoding partial caching unit 302 before the maximum likelihood decoding is attempted. This is because the computational complexity is expected to be reduced by using the held part when lost data is reconstructed by the subsequent Gauss elimination method.

Similarly to the second embodiment, the degree sorting unit 303 changes Formula (8) in which the identity matrix is prepared to the following relational expression by rearranging the matrix $H_\varsigma$ on the left side in the ascending order of degrees (S309).

[Math 10]

$$[H_\varsigma{''}]x_\varsigma{'} = [I_{m,m}][H_\varsigma{'}]x_\varsigma{'} \qquad (10)$$

Here, $H_\varsigma{''}$ is a matrix that is sorted in the ascending order of degrees. If degree sorting is limited to only column sorting, it is unnecessary to change the right side of the above Formula, and even when rows are changed, it is possible to cope with it by switching rows of the identity matrix on the right side and changing it to I''. Here, an example in which only highly effective columns are sorted is described, but in the case of a class called an LDPC-Staircase code, discharging of a subsequent process can be performed at a high speed by preferentially sorting an staircase matrix. Generally, it is desirable to avoid fill-in occurring during the discharging process to the utmost since it is associated with an increase in the computational complexity, but rearranging in which the fill-in is minimum is known to be an NP-complete problem. Here, the fill-in refers to what a value is input to a location that was originally an element of 0 in the discharging process. The method of sorting in the ascending order of degrees can easily reduce the occurrence of the fill-in, and thus a high-speed operation can be performed. As the staircase matrix is preferentially sorted, the occurrence of the fill-in can be further suppressed, leading to the high-speed operation. Moreover, as another speed increasing method, a technique such as the triangular matrix conversion is widely known, and this technique may be applied.

Then, the pivot selecting/discharging unit 304 performs the forward elimination on the rearranged matrix (S310). Since the discharging unit performs rearranging in which the occurrence of the fill-in is suppressed, the fast discharging can be performed.

When the triangular matrix conversion is performed, a form similar to Formula (9) can be obtained, and as the subsequent process (S306) of the Gauss elimination method decoding unit 305, the same process as in the second embodiment is performed.

As described above, in the channel decoding method according to the present embodiment, the trivial decoding unit 301 executes steps S301 to S305, the degree sorting unit 303 executes step S309, the pivot selecting/discharging unit 304 executes step S310, and the Gauss elimination method decoding unit 305 executes step S306.

Fourth Embodiment

Figure 9:
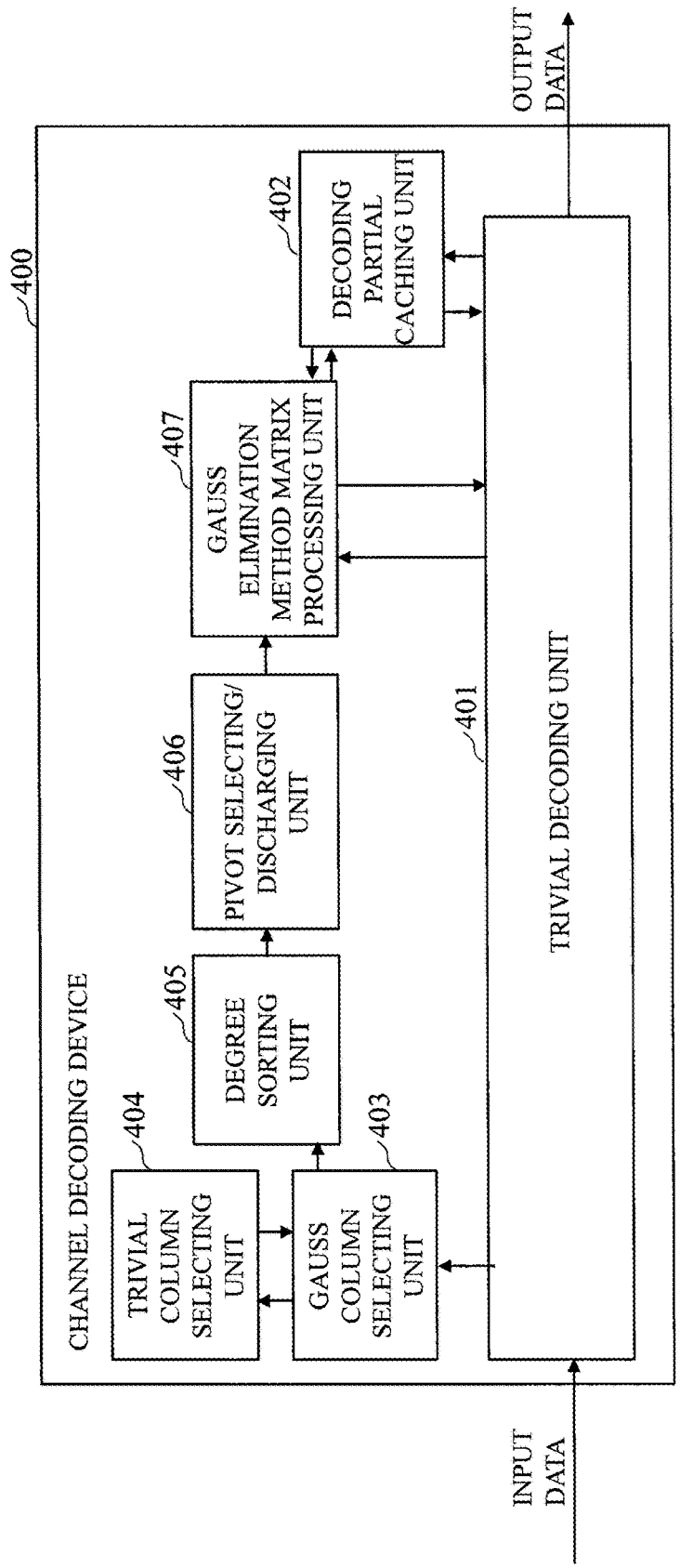
FIG. 9 is a basic configuration diagram illustrating a channel decoding device according to a fourth embodiment of the present disclosure.

FIG. 9 illustrates a basic configuration diagram of a channel decoding system that implements the maximum likelihood decoding using the trivial decoding method and the Gauss elimination method repeatedly. 401 indicates a trivial decoding unit that restores lost data by a small number operations, 402 indicates a decoding partial caching unit that holds partial data of a restoration operation process as a cache when lost data is reconstructed through the trivial decoding unit 401 and a Gauss elimination method decoding unit 407, 403 indicates a Gauss column selecting unit that selects a parity check matrix corresponding to lost data that is restored by the Gauss elimination method as a Gauss column, 404 indicates a trivial column selecting unit that selects a parity check matrix corresponding to lost data that is restored by the trivial decoding method as a trivial column, 405 indicates a degree sorting unit that sorts the sparse graphs according to a degree, and 406 indicates a pivot selecting/discharging unit that selects a pivot, converts the trivial column into an identity matrix through the forward elimination, and converts the Gauss column into a triangular matrix, and 407 indicates a Gauss elimination method decoding unit that actually restores lost data. The respective components will be described below.

Figure 10:
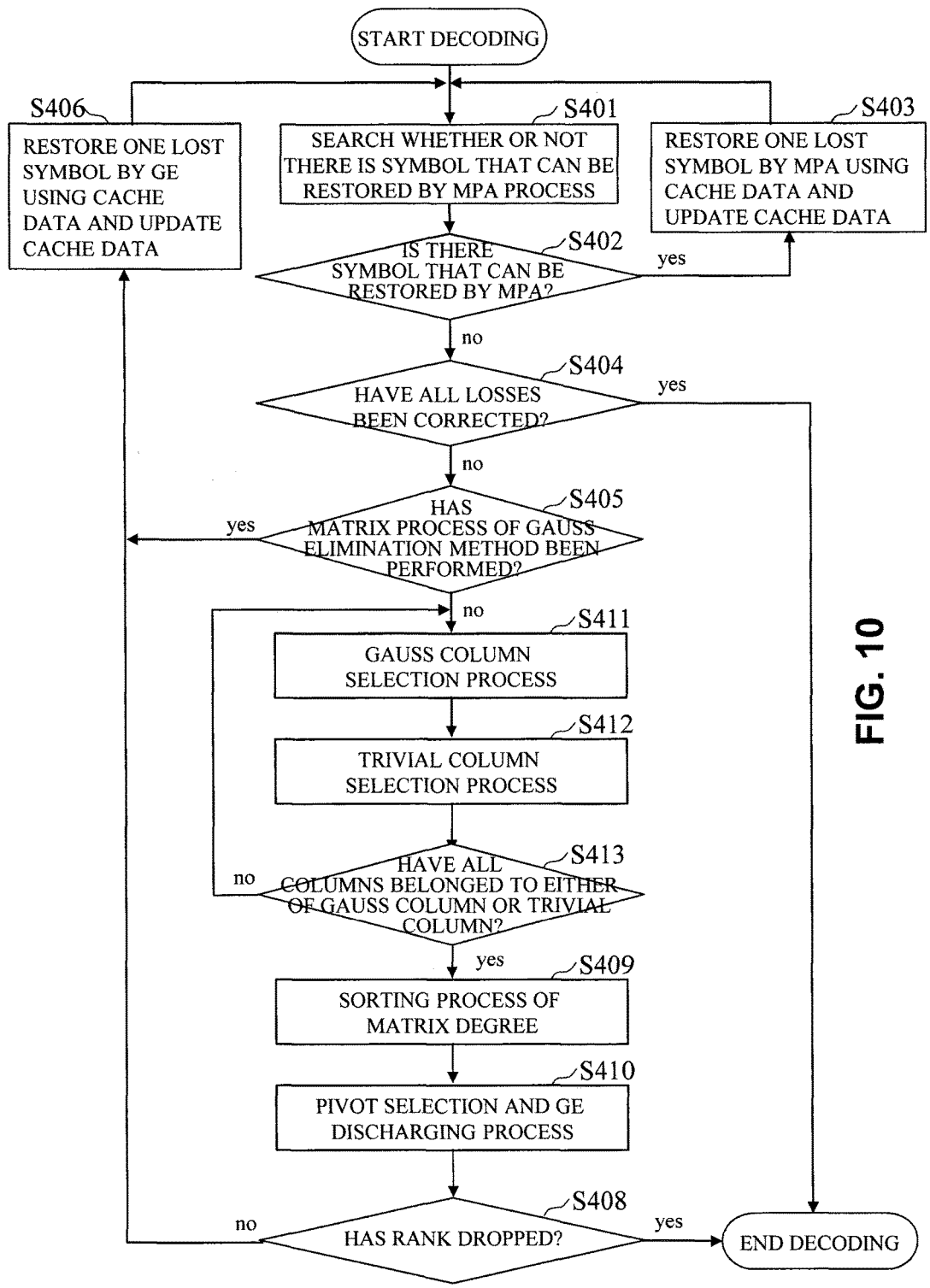
FIG. 10 is a flowchart illustrating an exemplary channel decoding method according to the fourth embodiment.

The present system is a channel decoding system that efficiently performs the maximum likelihood decoding on loss occurring on the erasure channel by a small number of processes. For the sake of simplicity, similarly to the first, second, and third embodiments, as a preferable example in which the present system functions effectively, an example in which IP packet transmission on the Internet serving as a representative channel of an erasure channel is assumed, and an LDPC code configured by a sparse graph is assumed as a code will be described below with reference to FIG. 10.

When input data is input to the channel decoding device 400, the input data is transferred to the trivial decoding unit 401, and an attempt to restore lost data is made (S401 to S403). In the linear code, it is previously known that a product of received data and a parity check matrix H of each block is 0 (zero). For this reason, the trivial decoding unit 401 uniquely restores one lost data having no relation with other lost data as the restored lost data.

If all lost data has been restored at the first trivial decoding unit (yes in S404), the decoding process ends, and data is output. However, when there is still lost data which has not been able to be restored by the first trivial decoding unit (no in S404), similarly to the first, second, and third embodiments, the maximum likelihood decoding is attempted by applying the Gauss elimination method (S405 to S413), but the restored data calculated by the trivial decoding unit 401 is held in the decoding partial caching unit 402 before the maximum likelihood decoding is attempted. This is because the computational complexity is expected to be reduced by using the held part when lost data is reconstructed by the subsequent Gauss elimination method.

Similarly to the second embodiment, in Formula (8) in which the identity matrix is prepared, the Gauss column selecting unit 403 selects one column in which lost data is highly likely to be subsequently restored by the Gauss elimination method from $H_\varsigma$ (S411). The decoding computational complexity is known to be changed by this selection algorithm, but for sakes of simplicity, an operation of selecting one column (a column in which the sum of all elements in a column is large) in which the degree of $H_\varsigma$ of Formula (8) is heavy is performed. After one column is designated as the Gauss column, if lost data corresponding to the Gauss column is assumed to have been restored by the trivial column selecting unit 404, a column corresponding to lost data that can be necessarily restored by the trivial decoding method is selected as the trivial column (S412). The lost data that can be necessarily restored by the trivial decoding method is lost data that can be uniquely reconstructed from anticipated restored data of a candidate restored by the Gauss elimination method and received data and is independent data form other lost data. The operations of 403 and 404 are repeated until all columns of $H_\zeta$ belong to either of the Gauss column or the trivial column (S413). For example, this determination is performed by the Gauss column selecting unit 403.

When all columns belong to either of the Gauss column or the trivial column, the process proceeds to S409. In S409, the degree sorting unit 405 rearranges the trivial column and the Gauss column (sorting). For the sorting, similarly to the third embodiment, the rearranging technique such as the triangular matrix conversion may be used, but in the present embodiment, for the sake of simplicity, the trivial column and the Gauss column are assumed to be rearranged in the ascending order of degrees (the order in which the sum of all elements in a column is small). The pivot selecting/discharging unit 406 performs identity matrix conversion on the trivial column by the forward elimination, and performs the triangular matrix conversion on the Gauss column. The identity matrix conversion and triangular matrix conversion correspond to steps of the Gauss elimination method. In this process, the pivot is selected in the ascending order of degrees, and similarly to the third embodiment, in the case of the LDPC-Stair code, and it is selected from an upper matrix of the echelon matrix, and thus the high-speed operation can be performed.

When the identity matrix conversion and the triangular matrix conversion are performed, similarly to Formula (9), the form of the upper triangular matrix can be obtained, and thus as the subsequent process of the Gauss elimination method decoding unit 407, the same process as in the second and third embodiments is performed.

As described above, in the channel decoding method according to the present embodiment, the trivial decoding unit 401 executes steps S401 to S405, the Gauss column selecting unit 403 executes steps S411 and S413, the trivial column selecting unit 404 executes step S412, the degree sorting unit 405 executes step S409, the pivot selecting/discharging unit 406 executes step S410, and the Gauss elimination method decoding unit 407 executes step S406.

As described above, in the present disclosure, the fast maximum likelihood decoding can be implemented at low computational complexity by decreasing lost data restored by the Gauss elimination method whenever possible and increasing lost data restored by the trivial decoding method whenever possible in the maximum likelihood decoding of the sparse graph code.

Further, the device of the present disclosure may be implemented by a computer and a program, and the program may be recorded in a recording medium or provided via a network.

INDUSTRIAL APPLICABILITY

The present disclosure can be applied to information communication industry.

REFERENCE SIGNS LIST

10: channel encoding device
11: channel encoding unit
20: packet-based transmitting device
21: packet transmitting unit
30: packet-based receiving device
31: received data analyzing unit
40, 100, 200, 300, 400: channel decoding device
41: channel decoding unit
42: maximum likelihood decoding unit
101, 201, 301, 401: trivial decoding unit
102, 203, 407: Gauss elimination method matrix processing unit
103, 204, 305: Gauss elimination method decoding unit
202, 302, 402: decoding partial caching unit
303, 405: degree sorting unit
304, 406: pivot selecting/discharging unit
403: Gauss column selecting unit
404: trivial column selecting unit

The invention claimed is:

1. A channel decoding device, comprising:
a computer; and
a storage device that contains a program that causes the computer to:
  receive a data string that includes redundant data encoded based on a relation of a sparse graph;
  detect generation of lost data lost in a channel using data from the data string; and
  multiple times alternately and repeatedly:
    (a) decode the lost data using a trivial decoding method for restoring one piece of the lost data having no relation with other lost data uniquely; and
    (b) decode the lost data using a Gauss elimination method,
  thus yielding corrected data,
  wherein
    first, the lost data is decoded using the trivial decoding method,
    decoding of lost data using the Gauss elimination method is performed on at least one piece of the lost data, and
    when the at least one piece of the lost data is decoded using the Gauss elimination method, decoding of the lost data using the trivial decoding method is performed using a decoding result using the Gauss elimination method.

2. The channel decoding device according to claim 1, comprising:
caching unit that acquires and stores an operation result in decoding the lost data using the trivial decoding method from a trivial decoding unit, and acquires and stores an operation result in decoding the lost data using the Gauss elimination method from a Gauss elimination method decoding unit;
the trivial decoding unit, which reads the operation result in decoding the lost data using the Gauss elimination method from the caching unit, decodes the lost data by applying the read operation result to an operation in the trivial decoding method, and stores the operation result by the trivial decoding method in the caching unit; and
the Gauss elimination method decoding unit, which reads the operation result in decoding the lost data using the trivial decoding method from the caching unit, decodes the lost data by applying the read operation result to an operation in the Gauss elimination method, and stores the operation result by the Gauss elimination method in the caching unit.

3. The channel decoding device according to claim 2, comprising:
a degree sorting unit that rearranges a check matrix corresponding to the lost data that has not been restored completely in the trivial decoding unit in ascending order of degrees of the check matrix; and
a pivot selecting/discharging unit that discharges the check matrix in ascending order of degrees of the check matrix as a triangular matrix using forward elimination.

4. The channel decoding device according to claim 3, further comprising:
   a Gauss column selecting unit that acquires a check matrix corresponding to the lost data that has not been restored completely in the trivial decoding unit, and selects one column in which the lost data is highly likely to be restored by the Gauss elimination method as a Gauss column from the check matrix; and
   a trivial column selecting unit that selects a column corresponding to the lost data that is restored by the trivial decoding method as a trivial column from the check matrix when it is assumed that the lost data of the Gauss column has been able to be restored,
   wherein until all columns of the check matrix belong to the Gauss column or the trivial column, alternately:
      (a) one column is selected as the Gauss column by the Gauss column selecting unit; and
      (b) the trivial column is selected by the trivial column selecting unit,
      the pivot selecting/discharging unit converts the trivial column into an identity matrix, and converts the Gauss column into the triangular matrix, and
      the Gauss elimination method decoding unit restores the lost data included in the Gauss column converted into the triangular matrix.

5. A channel decoding method that is performed by a computer in accordance with a program on a recording device, wherein the method comprises:
   receiving a data string that includes redundant data encoded based on a relation of a sparse graph;
   detecting generation of lost data lost in a channel using data from the data string; and
   multiple times alternately and repeatedly:
      (a) decoding the lost data using a trivial decoding method for restoring one piece of the lost data having no relation with other lost data uniquely; and
      (b) decoding the lost data using a Gauss elimination method,
      thus yielding corrected data,
      wherein
         first, the lost data is decoded using the trivial decoding method,
         decoding of lost data using the Gauss elimination method is performed on at least one piece of the lost data, and
         when the at least one piece of the lost data is decoded using the Gauss elimination method, decoding of the lost data using the trivial decoding method is performed using a decoding result using the Gauss elimination method.

6. The channel decoding method according to claim 5, further comprising:
   a caching process of acquiring and storing an operation result in decoding the lost data using the trivial decoding method from a trivial decoding process, and acquiring and storing an operation result in decoding the lost data using the Gauss elimination method from a Gauss elimination method decoding process;
   the trivial decoding process, which performs operations of reading the operation result in decoding the lost data using the Gauss elimination method from the caching process, decoding the lost data by applying the read operation result to an operation in the trivial decoding method, and storing the operation result by the trivial decoding method in the caching process; and
   the Gauss elimination method decoding process, which performs operations of reading the operation result in decoding the lost data using the trivial decoding method from the caching process, decoding the lost data by applying the read operation result to an operation in the Gauss elimination method, and storing the operation result by the Gauss elimination method in the caching process.

7. The channel decoding method according to claim 6, comprising:
   a degree sorting process of rearranging a check matrix corresponding to the lost data that has not been restored completely in the trivial decoding process in ascending order of degrees of the check matrix; and
   a pivot selecting/discharging process of discharging the check matrix in ascending order of degrees of the check matrix as a triangular matrix using forward elimination.

8. The channel decoding method according to claim 7, further comprising:
   a Gauss column selecting process of acquiring a check matrix corresponding to the lost data that has not been restored completely in the trivial decoding process, and selecting one column in which the lost data is highly likely to be restored by the Gauss elimination method as a Gauss column from the check matrix; and
   a trivial column selecting process of selecting a column corresponding to the lost data that is restored by the trivial decoding method as a trivial column from the check matrix when it is assumed that the lost data of the Gauss column has been able to be restored,
   wherein until all columns of the check matrix belong to the Gauss column or the trivial column, alternately:
      (a) one column is selected as the Gauss column by the Gauss column selecting process; and
      (b) the trivial column is selected by the trivial column selecting process,
      the pivot selecting/discharging process converting the trivial column into an identity matrix, and converts the Gauss column into the triangular matrix, and
      the Gauss elimination method decoding process restoring the lost data included in the Gauss column converted into the triangular matrix.

9. A non-transitory recording medium comprising a program that causes a computer to execute operations of:
   receiving a data string that includes redundant data encoded based on a relation of a sparse graph;
   detecting generation of lost data lost in a channel using data from the data string; and
   multiple times alternately and repeatedly:
      (a) decoding the lost data using a trivial decoding method for restoring one piece of the lost data having no relation with other lost data uniquely; and
      (b) decoding the lost data using a Gauss elimination method,
      thus yielding corrected data,
      wherein
         first, the lost data is decoded using the trivial decoding method,
         decoding of lost data using the Gauss elimination method is performed on at least one piece of the lost data, and
         when the at least one piece of the lost data is decoded using the Gauss elimination method, decoding of the lost data using the trivial decoding method is performed using a decoding result using the Gauss elimination method.

10. The non-transitory recording medium according to claim 9, wherein the program also causes the computer to perform operations of:

a caching process of acquiring and storing an operation result in decoding the lost data using the trivial decoding method from a trivial decoding process, and acquiring and storing an operation result in decoding the lost data using the Gauss elimination method from a Gauss elimination method decoding process;

the trivial decoding process, which performs operations of reading the operation result in decoding the lost data using the Gauss elimination method from the caching process, decoding the lost data by applying the read operation result to an operation in the trivial decoding method, and storing the operation result by the trivial decoding method in the caching process, and the Gauss elimination method decoding process, which performs operations of reading the operation result in decoding the lost data using the trivial decoding method from the caching process, decoding the lost data by applying the read operation result to an operation in the Gauss elimination method, and storing the operation result by the Gauss elimination method in the caching process.

11. The non-transitory recording medium according to claim 10, comprising:

a degree sorting process of rearranging a check matrix corresponding to the lost data that has not been restored completely in the trivial decoding process in ascending order of degrees of the check matrix; and a pivot selecting/discharging process of discharging the check matrix in ascending order of degrees of the check matrix as a triangular matrix using forward elimination.

12. The non-transitory recording medium according to claim 11, further comprising:

a Gauss column selecting process of acquiring a check matrix corresponding to the lost data that has not been restored completely in the trivial decoding process, and selecting one column in which the lost data is highly likely to be restored by the Gauss elimination method as a Gauss column from the check matrix; and a trivial column selecting process of selecting a column corresponding to the lost data that is restored by the trivial decoding method as a trivial column from the check matrix when it is assumed that the lost data of the Gauss column has been able to be restored, wherein until all columns of the check matrix belong to the Gauss column or the trivial column, alternately:
(a) one column is selected as the Gauss column by the Gauss column selecting process; and
(b) the trivial column is selected by the trivial column selecting process, the pivot selecting/discharging process converting the trivial column into an identity matrix, and converts the Gauss column into the triangular matrix, and the Gauss elimination method decoding process restoring the lost data included in the Gauss column converted into the triangular matrix.

* * * * *